United States Patent
Takahashi et al.

(10) Patent No.: US 9,455,208 B2
(45) Date of Patent: Sep. 27, 2016

(54) SEMICONDUCTOR DEVICE

(71) Applicant: Mitsubishi Electric Corporation, Tokyo (JP)

(72) Inventors: Takuya Takahashi, Tokyo (JP); Yoshitaka Otsubo, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/821,301

(22) Filed: Aug. 7, 2015

(65) Prior Publication Data

US 2016/0148852 A1 May 26, 2016

(30) Foreign Application Priority Data

Nov. 26, 2014 (JP) ................................ 2014-238347

(51) Int. Cl.
| | |
|---|---|
| *H01L 23/053* | (2006.01) |
| *H01L 23/498* | (2006.01) |
| *H01L 23/36* | (2006.01) |
| *H01L 23/00* | (2006.01) |

(52) U.S. Cl.
CPC ............. *H01L 23/053* (2013.01); *H01L 23/36* (2013.01); *H01L 23/49844* (2013.01); *H01L 23/562* (2013.01); *H01L 2224/48091* (2013.01); *H01L 2224/73265* (2013.01)

(58) Field of Classification Search
CPC H01L 23/053; H01L 23/36; H01L 23/49844
See application file for complete search history.

(56) References Cited

U.S. PATENT DOCUMENTS

| | | | |
|---|---|---|---|
| 5,686,758 A | 11/1997 | Arai et al. | |
| 5,825,085 A | 10/1998 | Masumoto et al. | |
| 2005/0199999 A1* | 9/2005 | Shirasawa | H01L 23/053 257/706 |
| 2009/0050957 A1* | 2/2009 | Nakao | H01L 23/053 257/328 |
| 2013/0270688 A1* | 10/2013 | Ota | H01L 23/36 257/690 |
| 2014/0167241 A1* | 6/2014 | Matsuoka | H01L 23/24 257/690 |
| 2015/0077943 A1* | 3/2015 | Miyake | H01L 23/053 361/709 |
| 2015/0270186 A1* | 9/2015 | Miyazawa | H01L 23/053 257/687 |

FOREIGN PATENT DOCUMENTS

| | | |
|---|---|---|
| JP | H07-326711 A | 12/1995 |
| JP | H09-069603 A | 3/1997 |

\* cited by examiner

*Primary Examiner* — Allan R Wilson
(74) *Attorney, Agent, or Firm* — Studebaker & Brackett PC

(57) ABSTRACT

An insertion vertical electrode region and part of a case-contact horizontal electrode region of an electrode insertion part of an external electrode is inserted and molded in an intra-case insertion region of a housing case. Inserting the case-contact horizontal electrode region, which serves as part of the electrode insertion part, in the intra-case insertion region allows the upper and lower surfaces of the case-contact horizontal electrode region to be in contact with the intra-case insertion region.

17 Claims, 7 Drawing Sheets

SEMICONDUCTOR DEVICE

BACKGROUND OF THE INVENTION

1. Field of the Invention

The present invention relates to a semiconductor device having a base plateless structure that does not use a substrate fixing base plate.

2. Description of the Background Art

As disclosed in, for example, Japanese Patent Application Laid-open No. 7-326711 (FIGS. 1 and 5), there have been conventionally proposals of semiconductor devices having a base plateless structure that does not use a metallic or other base plate for fixedly placing a substrate on which semiconductor elements are to be formed. Other semiconductor devices as disclosed in Japanese Patent Application Laid-Open No. 9-69603 (FIG. 5) have also conventionally been proposed in which an external electrode is integrally molded with an outer case on the upper surface of the outer case by insert molding, and one end of the external electrode is attached to a circuit conductive foil on an insulating substrate located inside the case.

However, the following problems to be solved exist with the semiconductor devices according to the aforementioned conventional techniques.

The semiconductor device disclosed in Japanese Patent Application Laid-open No. 7-326711 (FIGS. 1 and 5) that does not use a base plate has low stiffness and may encounter a situation in which, when the semiconductor device is fixed to a heat sink by application of a heat dissipating material and subsequent thread fastening or the like, a force is exerted on an insulating substrate, and the insulating substrate becomes warped upward in a convex form (which may be hereinafter abbreviated as "upward convex warpage"). If upward convex warpage occurs in the insulating substrate, there are problems, such as increased thermal resistance between the insulating substrate and the heat sink.

In the semiconductor device disclosed in Japanese Patent Application Laid-Open No. 9-69603 (FIG. 5), the electrode and the outer case are in contact at only a portion where the electrode passes through the upper surface of the case. Hence, the insulating substrate cannot be pressed strongly enough to prevent the occurrence of convex warpage in the electrode inside the case. This does not solve the problems due to upward convex warpage of the insulating substrate with Japanese Patent Application Laid-open No. 7-326711.

SUMMARY OF THE INVENTION

It is an object of the present invention to obtain a semiconductor device having a base plateless structure that does not use a substrate fixing base plate, which structure can prevent a phenomenon in which a substrate becomes warped upward in a convex form.

The semiconductor device according to the present invention includes an insulating substrate, a semiconductor element, an external electrode, and a housing case.

The insulating substrate has one main surface and the other main surface that are formed in a horizontal direction, and has a wiring pattern on the one main surface side. The semiconductor element is formed on the one main surface side of the insulating substrate. The external electrode has electrical connection with the wiring pattern or the semiconductor element and is provided on the one main surface of the insulating substrate.

The housing case houses the insulating substrate and the semiconductor element, and includes an electrode insertion region on the one main surface side of the insulating substrate, the electrode insertion region containing at least part of an electrode insertion part of the external electrode.

The external electrode includes a horizontal-direction electrode region formed in the horizontal direction and is configured to have an upper surface that is in contact with the electrode insertion region.

With the semiconductor device according to the present invention, the presence of the horizontal-direction electrode region increases the resistance of the electrode insertion region of the housing case against normal stress. That is, the external electrode can exert a strong force to press upward movement of the insulating substrate. This suppresses deformation of the insulating substrate and consequently improves the reliability of the semiconductor device.

These and other objects, features, aspects and advantages of the present invention will become more apparent from the following detailed description of the present invention when taken in conjunction with the accompanying drawings.

DESCRIPTION OF THE PREFERRED EMBODIMENTS

First Preferred Embodiment

Figure 1:
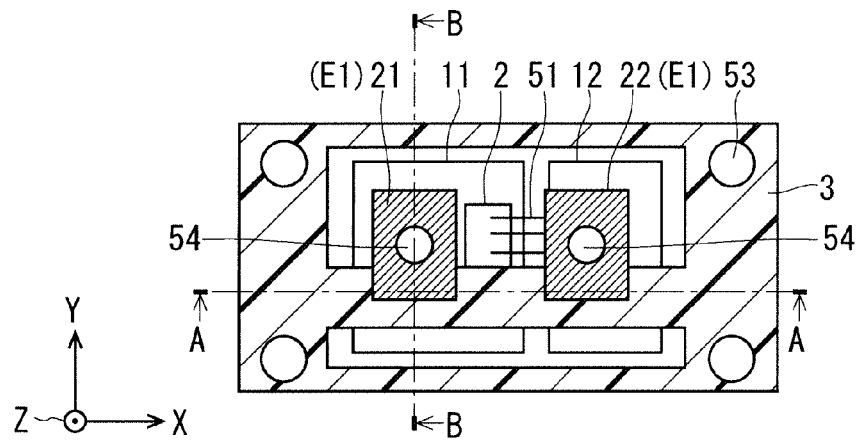
FIG. 1 is a plan view of an upper surface structure of a power module according to a first preferred embodiment of the present invention.
Figure 2:
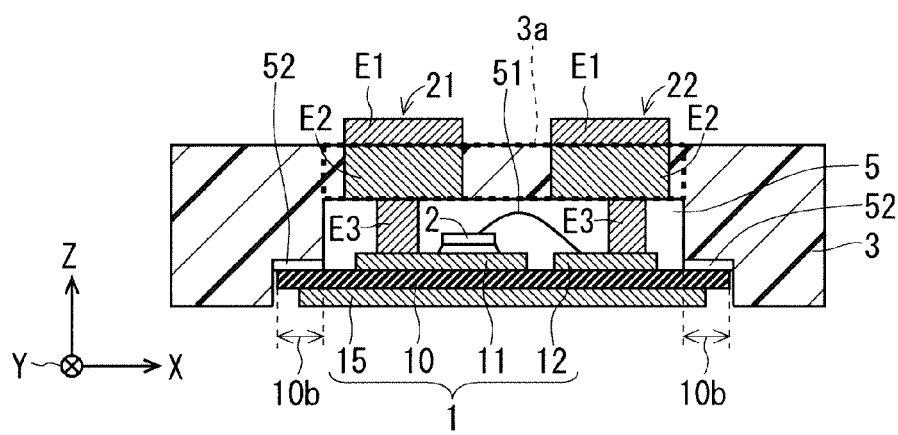
FIG. 2 is a cross-sectional view of a cross-sectional structure taken along a cross section A-A in FIG. 1.
Figure 3:
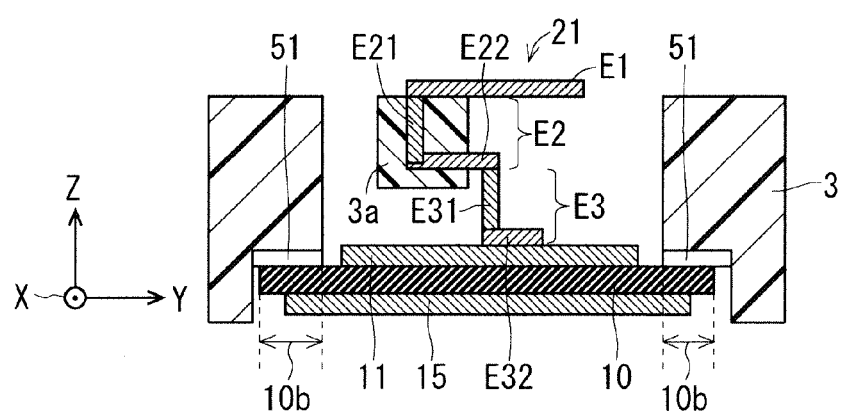
FIG. 3 is a cross-sectional view of a cross-sectional structure taken along a cross section B-B in FIG. 1.

FIG. 1 is a plan view of an upper surface structure of a power module (semiconductor device) according to a first preferred embodiment of the present invention. FIG. 2 is a cross-sectional view of a cross-sectional structure taken along a cross section A-A in FIG. 1. FIG. 3 is a cross-sectional view of a cross-sectional structure taken along a cross section B-B in FIG. 1. An XYZ orthogonal coordinate system is illustrated in each of FIGS. 1 to 3. Hereinafter, the power module of the first preferred embodiment will be described with reference to FIGS. 1 to 3.

An insulating substrate 1 is constituted by an insulating plate 10, wiring patterns 11 and 12, and a backside electrode 15 (internal electrode). The wiring patterns 11 and 12 are formed on the front surface of the insulating plate 10, and the backside electrode 15 is formed on the back surface of the insulating plate 10.

On the wiring pattern 11 of the insulating substrate 1, a semiconductor element 2 made of silicon (Si), for example, is bonded with solder or other means. In the structure of FIG. 2, the semiconductor element 2 and the wiring pattern 12 are electrically connected to each other by a wire 51.

In this way, the insulating substrate 1 has front and back surfaces (one and other main surfaces) that are formed in horizontal directions defined by X and Y directions (first and second directions), with the semiconductor element 2 and the wiring patterns 11 and 12 being formed on the front surface side and the backside electrode 15 being formed on the back surface side with reference to the insulating plate 10.

External electrodes 21 and 22 (first and second external electrodes) are provided on the wiring patterns 11 and 12. Most of the insulating substrate 1, the semiconductor element 2, and the external electrodes 21 and 22 are housed in a housing case 3 in itself or in an accommodation space 5 of the housing case 3, whereas the backside electrode 15 is exposed to open air. The housing case 3 is bonded with an adhesive 52 to case bonding regions 10b, which are end regions of the insulating plate 10. The upper surface of the housing case 3 is partly open and has attachment holes 53, each having a circular shape in plan view, at the four corners of the outer circumference.

The external electrodes 21 and 22 are each constituted by an external connection part E1, an electrode insertion part E2, and a substrate connection part E3. The external connection parts E1 are formed on the upper surface of the housing case 3, i.e., outside the housing case 3, most of the electrode insertion parts E2 are inserted in an intra-case insertion region 3a of the housing case 3, and the substrate connection parts E3 are formed within the accommodation space 5 of the housing case 3 and in contact with the surfaces of the wiring patterns 11 and 12. In this way, the external connection parts E1 are provided outside the housing case 3, the substrate connection parts E3 is directly connected to the surface of the insulating substrate 1 (wiring patterns 11 and 12), and the electrode insertion parts E2 are provided between external connection parts E1 and the substrate connection parts E3. The substrate connection parts E3 have an attachment hole 54 in the center.

As illustrated in FIG. 3, the substrate connection part E3 is constituted by a supporting horizontal electrode region E32 that is in contact with the surface of the wiring pattern 11, and a supporting vertical electrode region E31 that is continuous with the supporting horizontal electrode region E32 and extends in the vertical direction (+Z direction). The electrode insertion part E2 is constituted by a case-contact horizontal electrode region E22 (horizontal-direction electrode region) that is continuous with the supporting vertical electrode region E31, has a width in the X direction, and extends in the horizontal direction (Y direction), and an insertion vertical electrode region E21 that is continuous with the case-contact horizontal electrode region E22 and extends in the vertical direction.

The entire insertion vertical electrode region E21 and part of the case-contact horizontal electrode region E22 are inserted and molded in the intra-case insertion region 3a (electrode insertion region) of the housing case 3 as illustrated in FIG. 3. In other words, the case-contact horizontal electrode region E22 serving as part of the electrode insertion part E2 is inserted in the intra-case insertion region 3a.

In this way, the external electrodes 21 and 22 in the power module of the first preferred embodiment are configured such that the upper and lower surfaces of their case-contact horizontal electrode regions E22 are both in contact with the intra-case insertion region 3a.

The presence of the case-contact horizontal electrode region E22 increases the resistance of the intra-case insertion region 3a of the housing case 3 against normal stress. Specifically, when the insulating substrate 1 deforms upward in the vertical direction (i.e., deforms in the +Z direction), the external electrodes 21 and 22 that are fixed by inserting the electrode insertion parts E2 in the housing case 3 can exert a strong force to press the insulating substrate 1 downward (in the −Z direction). This suppresses deformation of the insulating substrate 1 and improves the reliability of the device, resulting in an increase in the longevity of the power module of the first preferred embodiment.

If a heat dissipating material (not shown) is further provided on the backside electrode 15, the pressure of the external electrodes 21 and 22 can expand a region of contact between the backside electrode 15 and the heat dissipating material. This improves the thermal resistance of the insulating substrate 1 and suppresses deformation of the insulating substrate 1 due to changes in temperature, thus improving the reliability of the device.

The insertion of the case-contact horizontal electrode regions E22 in the intra-case insertion region 3a in the power module of the first preferred embodiment allows both of the upper and lower surfaces of the case-contact horizontal electrode regions E22 to be in contact with the intra-case insertion region 3a. This makes it possible to exert an upward force against downward deformation of the insulating substrate 1 in the vertical direction, suppressing downward deformation of the insulating substrate 1.

Additionally, the backside electrode 15 in the power module of the first preferred embodiment has a region that overlaps with the case bonding regions 10b when viewed in plan view.

This portion of the backside electrode 15 that overlaps with the case bonding regions 10b in plan view can effectively improve the stiffness of the insulating substrate 1 including the insulating plate 10, when stress concentrates on the boundaries of the case bonding regions 10b of the insulating plate 10 at the time of deformation of the insulating substrate 1. It is thus possible to alleviate the above stress and improve the reliability of the power module.

Specifically, although at the time of deformation of the insulating substrate 1, stress concentrates on the boundaries of the case bonding regions 10b that connect the insulating substrate 1 and the housing case 3, the presence of the backside electrode 15 in the region that overlaps with the case bonding regions 10b in plan view improves resistance to deformation of the ceramic or other insulating plate 10 of the insulating substrate 1 and to the occurrence of cracks in the insulating plate 10, thereby improving the reliability of the device.

The power module of the first preferred embodiment can increase the stiffness of the intra-case insertion region 3a by inserting the electrode insertion parts E2 of the two external electrodes 21 and 22 (first and second external electrodes) in the intra-case insertion region 3a, and therefore can further suppress deformation of the insulating substrate 1.

The power module of the first preferred embodiment has a relatively high degree of flexibility in the place where the substrate connection parts E3 of the external electrodes 21 and 22 are to be formed on the surface of the insulating substrate 1. It is thus possible to optimize places that are to be pressed by the external electrodes 21 and 22.

While copper (Cu), aluminum (Al), or other materials can be used for the wiring patterns 11 and 12 and the backside electrode 15, it is desirable to use Cu to reduce thermal resistance.

It is also desirable for the insulating material of the insulating plate 10 of the insulating substrate 1 to use silicon nitride (SiN) that has higher fracture resistance than aluminum nitride (AlN) or other materials. In the case of using SiN, the copper thicknesses of the wiring patterns 11 and 12 and the backside electrode 15 of the insulating substrate 1 is desirably 0.6 mm or more, which is difficult to achieve with AlN, in order to reduce thermal resistance. Alternatively, instead of creating the accommodation space 5, the top ends of the semiconductor element 2 and the insulating substrate 1 may be sealed for insulation. In this case, it is desirable to use a gel or a resin as a sealing material.

A case resin that is used to make the housing case 3 is desirably polyphenylene sulfide (PPS) or polybutylene terephthalate (PBT) that has high stiffness. The attachment holes 53 serving as a case attachment part may be arranged in various ways as long as there is at least one attachment hole, and may have shapes other than circular in plan view.

Note that the structures of the electrode insertion parts E2 and the substrate connection parts E3 may have different cross-sectional shapes other than those illustrated in FIG. 3 as long as they can sufficiently suppress deformation of the external electrodes 21 and 22 caused by the stress associated with the deformation of the insulating substrate 1. The external connection parts E1 are not limited to the structure that is formed in the horizontal direction, which is the direction of formation of the insulating substrate 1, and instead they may extend in the vertical direction.

The electrical connection between the semiconductor element 2 and the wiring patterns 11 and 12 may be established by means using conductive members other than the wire 51, such as soldering between the electrodes. In addition, the direct connection between the external electrodes 21, 22 and the wiring patterns 11, 12 of the insulating substrate 1 may be established by connection methods such as ultrasonic bonding, solder bonding, or pressure welding that can ensure conductivity. A structure is also possible in which the side surfaces of the insulating substrate 1 are not covered with the housing case 3. The number of insulating substrates 1 may be two or more.

Second Preferred Embodiment

Figure 4:
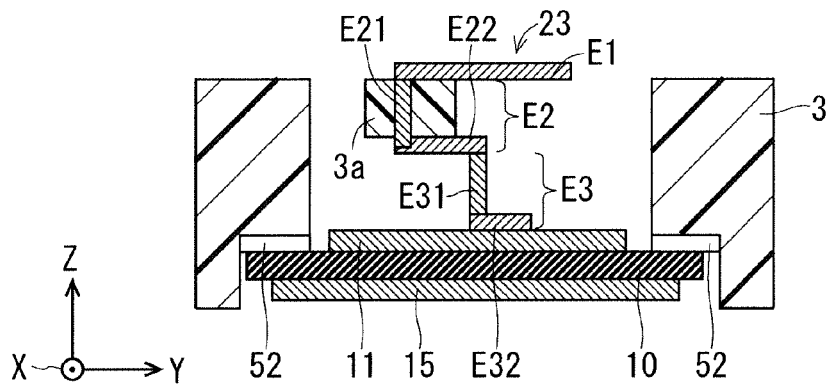
FIG. 4 is a cross-sectional view of a cross-sectional structure of a power module according to a second preferred embodiment of the present invention.

FIG. 4 is a cross-sectional view of a cross-sectional structure of a power module according to a second preferred embodiment of the present invention. An XYZ orthogonal coordinate system is illustrated in FIG. 4. Note that FIG. 4 corresponds to the cross section B-B in FIG. 1 of the first preferred embodiment, the same reference numerals have been given to constituent elements that are similar to those of the first preferred embodiment, and descriptions thereof have been appropriately omitted.

As illustrated in FIG. 4, a feature of the power module of the second preferred embodiment is that at least one of the external electrodes 21 and 22 of the first preferred embodiment is replaced by an external electrode 23. Similarly to the external electrodes 21 and 22 of the first preferred embodiment, the external electrode 23 in the power module of the second preferred embodiment is constituted by an external connection part E1, an electrode insertion part E2, and a substrate connection part E3, but it differs in that the case-contact horizontal electrode region E22 of the electrode insertion part E2 is not inserted in the intra-case insertion region 3a and is configured such that the bottom surface of the intra-case insertion region 3a is in contact with the upper surface of the case-contact horizontal electrode region E22. In other words, the lower end of the insertion vertical electrode region E21 of the electrode insertion part E2 projects from the bottom surface of the intra-case insertion region 3a, and the case-contact horizontal electrode region E22 extends laterally along the bottom surface of the intra-case insertion region 3a.

In this way, the external electrode 23 in the power module of the second preferred embodiment is configured such that the upper surface of the case-contact horizontal electrode region E22 is in contact with the bottom surface of the intra-case insertion region 3a. This produces the same effect of being able to suppress upward (+Z direction) deformation of the insulating substrate 1 as in the first preferred embodiment.

In addition, the power module of the second preferred embodiment can be relatively easily manufactured because there is no need to insert the case-contact horizontal electrode region E22 in the intra-case insertion region 3a.

Third Preferred Embodiment

Figure 5:
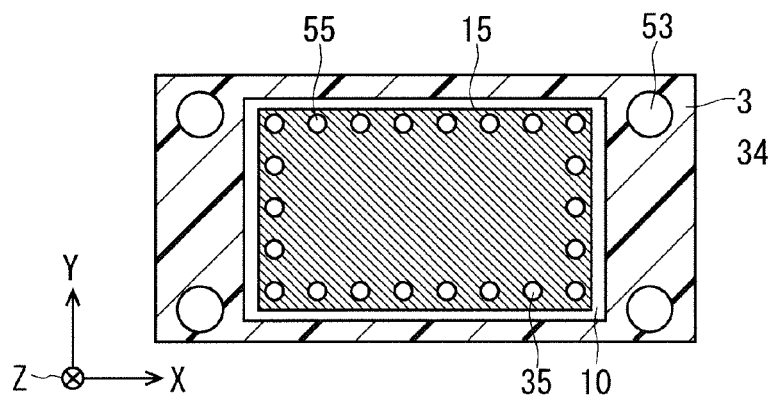
FIG. 5 is a plan view of the underside structure of a power module according to a third preferred embodiment of the present invention.

FIG. 5 is a plan view of the underside structure of a power module according to a third preferred embodiment of the present invention. An XYZ orthogonal coordinate system is illustrated in FIG. 5. Note that the same reference numerals have been given to constituent elements that are similar to those of the first preferred embodiment, and descriptions thereof have been appropriately omitted.

As illustrated in FIG. 5, a feature of the power module of the third preferred embodiment is that a plurality of dimples (recessed parts) 55, each being recessed from the other region toward the front surface side (one main surface side) of the insulating substrate 1, are provided in the outer peripheral portion of the underside (surface on the other main surface side) of the backside electrode 15. These dimples 55 alleviate the stress placed on the boundary of the backside electrode 15 and thereby reduce the occurrence of a phenomenon in which cracks occurs in the insulating plate 10 of the insulating substrate 1, thus improving the reliability of the device. The external electrodes of the third preferred embodiment may be either the external electrodes 21 and 22 of the first preferred embodiment or the external electrode 23 of the second preferred embodiment.

In this way, the power module of the third preferred embodiment that includes the plurality of dimples 55 can, in addition to achieving the effect of the first or second preferred embodiment, alleviate stress placed on the boundary of the backside electrode 15. This improves the reliability of the device.

Note that the above stress is mainly a horizontal force that is produced at the interface between the backside electrode 15 and the back surface of the insulating plate 10 due to, for example, a difference in linear expansion coefficient caused between the backside electrode 15 and the insulating plate 10 by changes in temperature.

Alternatively, a plurality of through holes that penetrate the backside electrode 15 and expose the insulating plate 10 may be formed, instead of the plurality of dimples 55 having bottom surfaces. In other words, the effect of the third preferred embodiment can be achieved by providing either a plurality of dimples 55 or a plurality of through holes as a plurality of recessed parts that are formed on the underside of the backside electrode 15 and each at least include a region that is recessed toward the front surface side.

Fourth Preferred Embodiment

Figure 6:
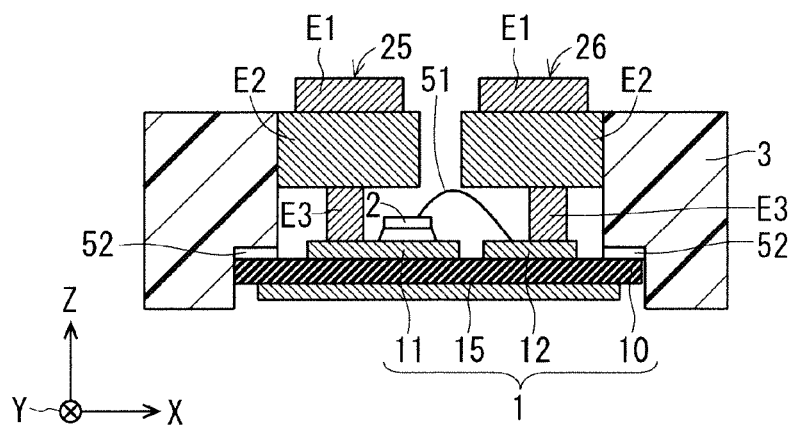
FIG. 6 is a cross-sectional view of a cross-sectional structure of a power module according to a fourth preferred embodiment.

FIG. 6 is a cross-sectional view of a cross-sectional structure of a power module according to a fourth preferred embodiment. An XYZ orthogonal coordinate system is illustrated in FIG. 6. Note that FIG. 6 corresponds to a cross-sectional structure taken along the cross section A-A in FIG. 1, the same reference numerals have been given to constituent elements that are similar to those of the first preferred embodiment, and descriptions thereof have been appropriately omitted.

As illustrated in FIG. 6, a feature of the power module of the fourth preferred embodiment is that the external electrodes 21 and 22 of the first preferred embodiment or the external electrode 23 of the second preferred embodiment is replaced by external electrodes 25 and 26. The external electrodes 25 and 26 of the fourth preferred embodiment are each formed to have such an electrode width that the X-direction width of the electrode insertion part E2 is greater than those of the external connection part E1 and the substrate connection part E3.

For easy understanding of the internal structure of the housing case 3, the intra-case insertion region 3a is not illustrated in FIG. 6. In actuality, at least most of the insertion vertical electrode regions E21 of the electrode insertion parts E2 are inserted in the intra-case insertion region 3a, as illustrated in FIGS. 2 to 4.

In this way, the electrode insertion parts E2 in the power module of the fourth preferred embodiment are set to have a greater width in the X direction, which is one of the X and Y directions that define the horizontal directions, than the external connection part E1 and the substrate connection part E3.

The power module of the fourth preferred embodiment with increased width of the electrode insertion part E2 can enhance adhesion in the intra-case insertion region 3a of the housing case 3, and accordingly can further suppress deformation of the insulating substrate 1.

Fifth Preferred Embodiment

Figure 7:
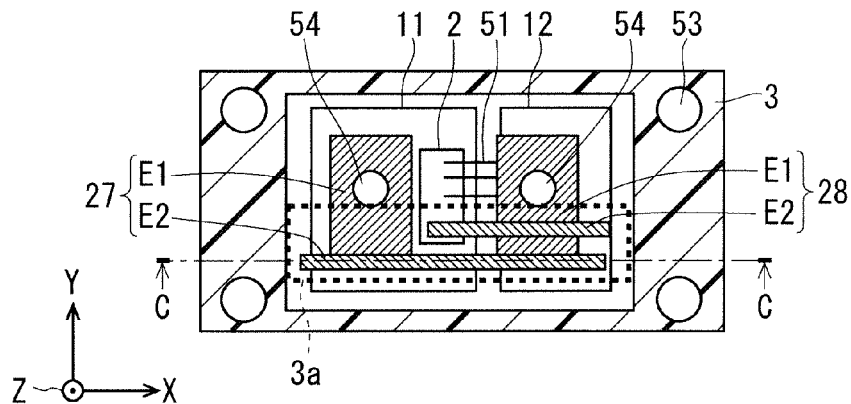
FIG. 7 is a plan view of an upper surface structure of a power module according to a fifth preferred embodiment.
Figure 8:
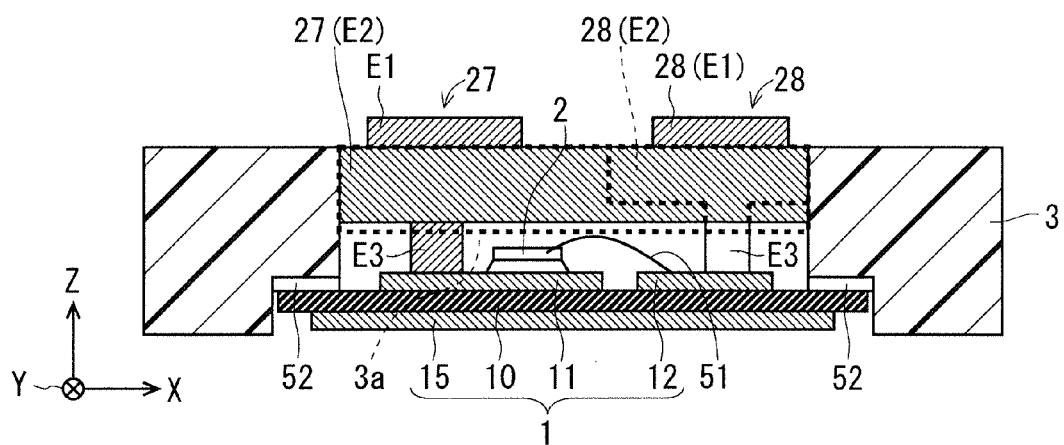
FIG. 8 is a cross-sectional view (part 1) of a cross-sectional structure taken along a cross section C-C in FIG. 7.
Figure 9:
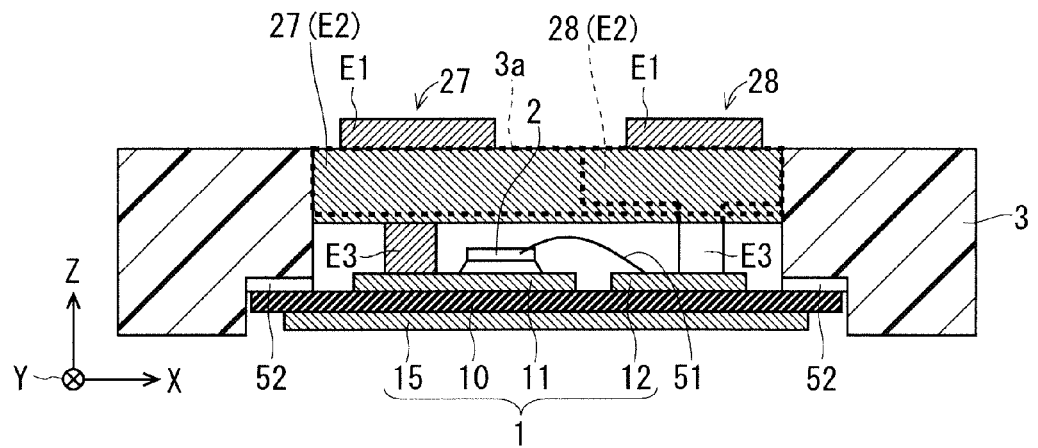
FIG. 9 is another cross-sectional view (part 2) of the cross-sectional structure taken along the cross section C-C in FIG. 7.

FIG. 7 is a plan view of an upper surface structure of a power module according to a fifth preferred embodiment. FIGS. 8 and 9 are both cross-sectional views of a cross-sectional structure taken along a cross section C-C in FIG. 7. An XYZ orthogonal coordinate system is illustrated in each of FIGS. 7 to 9. Note that the same reference numerals have been given to constituent elements that are similar to those of the first preferred embodiment, and descriptions thereof have been appropriately omitted.

As illustrated in FIGS. 7 to 9, a feature of the power module of the fifth preferred embodiment is that the external electrodes 21 and 22 of the first preferred embodiment or the external electrode 23 of the second preferred embodiment is replaced by external electrodes 27 and 28 (first and second external electrodes). Similarly to the external electrodes 25 and 26 of the fourth preferred embodiment, the external electrodes 27 and 28 of the fifth preferred embodiment are each configured to have such an electrode width that the X-direction width of the electrode insertion parts E2 is greater than those of the external connection part E1 and the substrate connection part E3.

The electrode insertion part E2 of the external electrode 27 extends to above the wiring pattern 12 in the X direction. This consequently produces a side-view overlapping structure of the electrode insertion parts E2 in which, when viewed from a side surface defined by the X and Z directions, there is an overlapping region between the electrode insertion part E2 of the external electrode 27 and the electrode insertion part E2 of the external electrode 28.

FIG. 8 illustrates a cross-sectional structure in which the case-contact horizontal electrode regions E22 of the electrode insertion parts E2 are inserted in the intra-case insertion region 3a as in the first preferred embodiment, and FIG. 9 illustrates a cross-sectional structure in which the case-contact horizontal electrode regions E22 of the electrode insertion parts E2 are formed on the external bottom surface of the intra-case insertion region 3a as in the second preferred embodiment. For easy understanding of the overlapping structure of the electrode insertion parts E2, FIGS. 8 and 9 schematically show this structure by, for example, indicating the electrode insertion part E2 of the external electrode 28 by the dotted line, and therefore, some portions do not exactly match the corresponding portions in the cross section C-C in FIG. 7. For example, for easy understanding of the presence of the external electrode 28, the bottom surface of the electrode insertion part E2 of the external electrode 28 is shown shallower than the actual bottom surface, although in actuality the bottom surface of the electrode insertion part E2 of the external electrode 28 is formed at approximately the same level as the bottom surface of the electrode insertion part E2 of the external electrode 27.

The power module of the fifth preferred embodiment with the aforementioned structure can achieve the following effect in addition to the effect of the first or second preferred embodiment and the effect of the fourth preferred embodiment.

The power module of the fifth preferred embodiment that includes the side-view overlapping structure of the electrode insertion parts E2 between the external electrodes 27 and 28 can further increase the stiffness of the intra-case insertion region 3a and increase the pressure of the external electrodes 27 and 28 on the insulating substrate 1 within the intra-case insertion region 3a, thus further suppressing the deformation of the insulating substrate 1.

Moreover, in the case where a power module is configured to have such an electrical characteristic that out of the external electrodes 27 and 28, current flows in from the external electrode 27 and flows out from the external electrode 28, the effect of cancelling the magnetic field works between the external electrodes 27 and 28 in the side-view overlapping region of the electrode insertion part E2. It is thus possible to anticipate the effect of reducing the inductance of the device.

While the above-described fifth preferred embodiment describes a mode which the electrode insertion parts E2 of the external electrodes 27 and 28 overlap when viewed from the side, a mode is also possible in which the electrode insertion parts E2 of the external electrodes 27 and 28 overlap when viewed from above. In other words, a mode is possible in which at least part of the electrode insertion parts E2 of the external electrodes 27 and 28, which are first and second external electrodes, overlap in the intra-case insertion region 3a when viewed in plan view or when viewed from the side.

Sixth Preferred Embodiment

Figure 10:
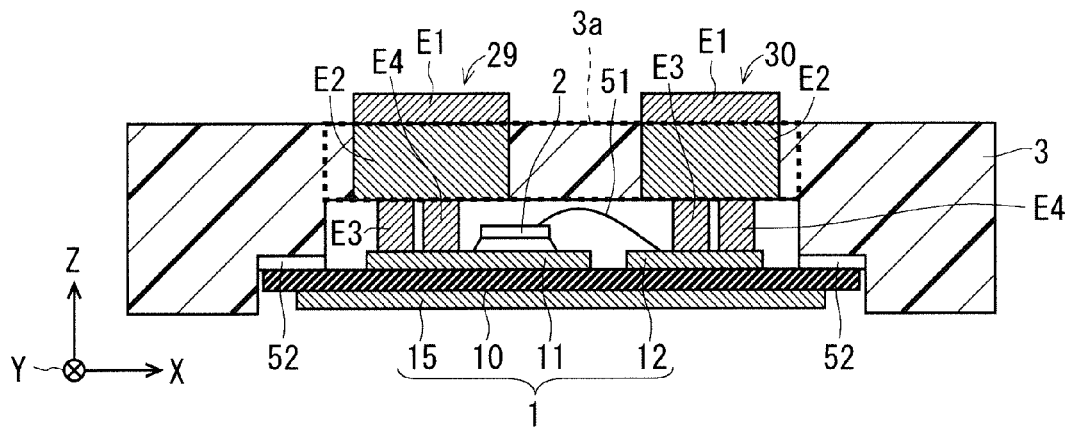
FIG. 10 is a cross-sectional view of a cross-sectional structure of a power module according to a sixth preferred embodiment.

FIG. 10 is a cross-sectional view of a cross-sectional structure of a power module according to a sixth preferred embodiment. An XYZ orthogonal coordinate system is illustrated in FIG. 10. Note that FIG. 10 corresponds to the cross section A-A in FIG. 1 of the first preferred embodiment, the same reference numerals have been given to constituent elements that are similar to those of the first preferred embodiment, and descriptions thereof have been appropriately omitted.

As illustrated in FIG. 10, a feature of the power module of the sixth preferred embodiment is that the external electrodes 21 and 22 of the first preferred embodiment or the external electrode 23 of the second preferred embodiment is replaced by external electrodes 29 and 30. The external electrodes 29 and 30 of the sixth preferred embodiment each include another substrate connection part E4 in addition to the substrate connection part E3. The substrate connection parts E3 and E4 of the external electrode 29 are directly connected to the wiring pattern 11, and the substrate connection parts E3 and E4 of the external electrode 30 is directly connected to the wiring pattern 12.

The power module of the sixth preferred embodiment with the aforementioned structure can achieve the following effect in addition to the effect of the first or second preferred embodiment.

The external electrodes 29 and 30 of the sixth preferred embodiment each include the two substrate connection parts E3 and E4 that have direct connection with the surface of the insulating substrate 1. It is thus possible to increase the pressure of the external electrodes 29 and 30 to be applied to the insulating substrate 1 and to further suppress the deformation of the insulating substrate 1.

Additionally, the provision of the plurality of substrate connection parts E3 and E4 can reduce the electrical resistance of each of the external electrodes 29 and 30 and enables the supply of a large current.

Seventh Preferred Embodiment

Figure 11:
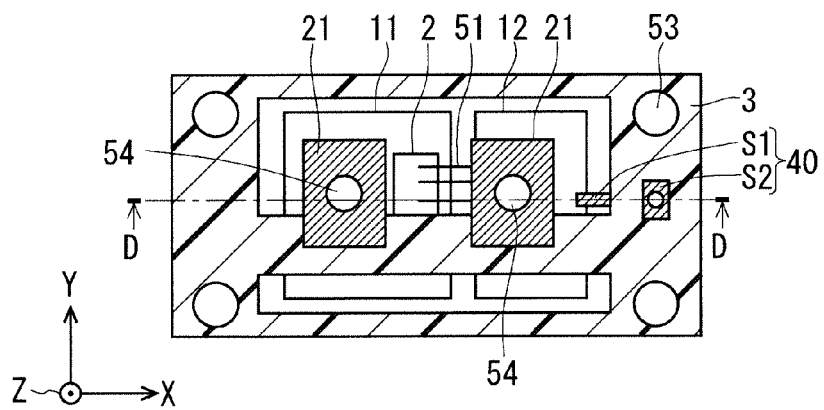
FIG. 11 is a plan view of an upper surface structure of a power module according to a seventh preferred embodiment.
Figure 12:
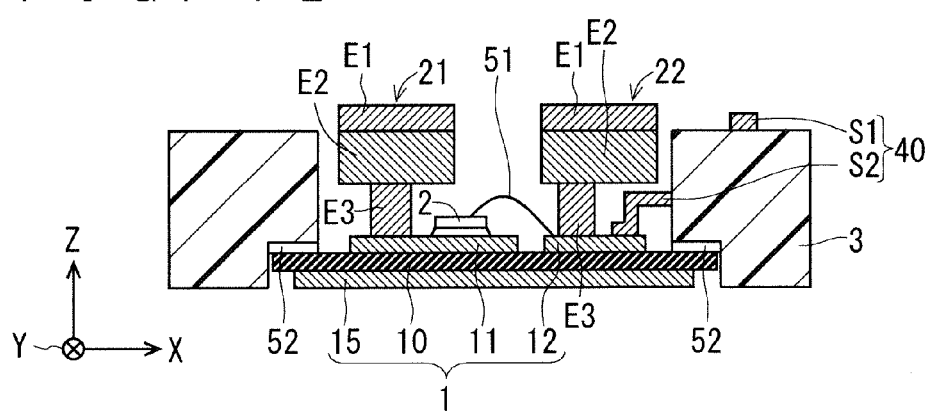
FIG. 12 is a cross-sectional view of a cross-sectional structure taken along a cross section D-D in FIG. 11.

FIG. 11 is a plan view of an upper surface structure of a power module according to a seventh preferred embodiment. FIG. 12 is a cross-sectional view of a cross-sectional structure taken along a cross section D-D in FIG. 11. An XYZ orthogonal coordinate system is illustrated in each of FIGS. 11 and 12. Note that the same reference numerals have been given to constituent elements that are similar to those of the first preferred embodiment, and descriptions thereof have been appropriately omitted.

As illustrated in FIGS. 11 and 12, the seventh preferred embodiment is such that a signal external terminal 40 serving as a signal electrode is further formed on the wiring pattern 12 in addition to the external electrodes 21 and 22 of the first preferred embodiment. The signal external terminal 40 has an external connection part 51 that is provided on the upper surface of the housing case 3, and an internal connection part S2 that is directly connected to the wiring pattern 12. Then, a portion (not shown) of the signal external terminal 40 (signal terminal) between the external connection part 51 and the internal connection part S2 is inserted in the housing case 3 in the same manner as the electrode insertion parts E2 of the external electrodes 21 and 22.

The signal external terminal 40 has lower current propagation capability than the external electrodes 21 and 22 and is used for control signals or other signals. To be more specific, when the semiconductor element 2 is an IGBT element, the signal external terminal 40 is used for, for example, a gate electrode, an emitter electrode, and a temperature measuring terminal. The signal external terminal 40 is typically configured to have a smaller width and a thinner plate thickness than the external electrodes 21 and 22 that pass current, and thus has lower current propagation capability than the external electrodes 21 and 22 as mentioned above.

In this way, the presence of the signal external terminal 40 that includes a portion inserted in the housing case 3 can also exert a force to press against upward movement of the insulating substrate 1 in the vertical direction. It is thus possible to suppress the deformation of the insulating substrate 1 more than the power module of the first preferred embodiment can and to improve the reliability of the device.

While the above-described seventh preferred embodiment describes a structure in which the power module of the first preferred embodiment illustrated in FIGS. 1 to 3 is provided with the signal external terminal 40, the signal external terminal 40 may also be provided in the structures of the other second to sixth preferred embodiments.

Eighth Preferred Embodiment

Figure 13:
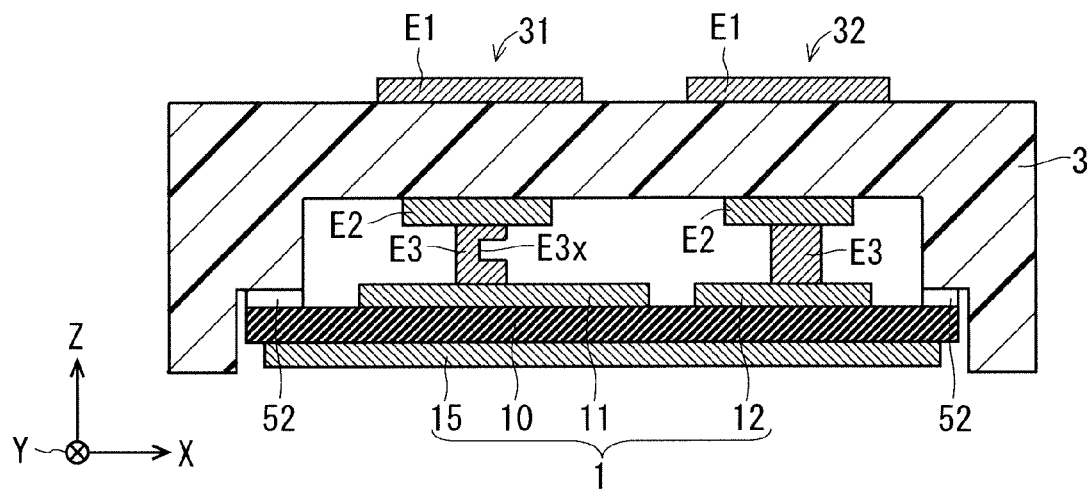
FIG. 13 is a cross-sectional view of a cross-sectional structure of a power module according to an eighth preferred embodiment.

FIG. 13 is a cross-sectional view of a cross-sectional structure of a power module according to an eighth preferred embodiment. An XYZ orthogonal coordinate system is illustrated in FIG. 13. Note that FIG. 13 corresponds to the cross section A-A in FIG. 1, the same reference numerals have been given to constituent elements that are similar to those of the first preferred embodiment, and descriptions thereof have been appropriately omitted.

As illustrated in FIG. 13, a feature of the power module of the eighth preferred embodiment is that the external electrodes 21 and 22 of the first preferred embodiment or the external electrode 23 of the second preferred embodiment is replaced by external electrodes 31 and 32. A substrate connection part E3 of the external electrode 31 of the eighth preferred embodiment is characterized in that it includes a narrow-width region E3$x$ whose X-direction width is smaller than that of the other region. Note that the Y-direction width of the narrow-width region E3$x$ is approximately the same as or smaller than that of the other region.

The power module of the eighth preferred embodiment with the aforementioned structure can achieve the following effect in addition to the same effect of the first or second preferred embodiment.

The power module of the eighth preferred embodiment has low stiffness in the narrow-width region E3$x$ of the substrate connection part E3, and therefore can alleviate stress placed on the interface of connection between the insulating substrate 1 (wiring patterns 11 and 12) and the substrate connection part E3. This makes it possible to reduce stress placed on the interface of connection between the insulating substrate 1 and the external electrode 31 at the time of changes in temperature and to improve the reliability of the device.

Note that the above stress is mainly a horizontal force that is produced at the interface of connection between the wiring patterns 11, 12 on the front surface side of the insulating substrate 1 and the external electrodes 31 and 32 due to, for example, a difference in linear expansion coefficient caused between the wiring patterns 11, 12 and the external electrodes 31, 32 by changes in temperature.

Ninth Preferred Embodiment

Figure 14:
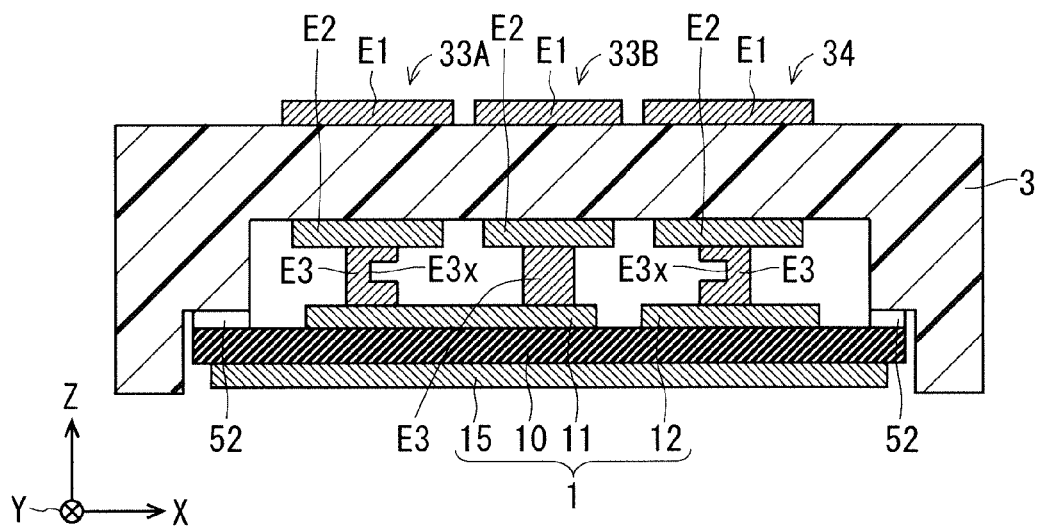
FIG. 14 is a cross-sectional view of a cross-sectional structure of a power module according to a ninth preferred embodiment.

FIG. 14 is a cross-sectional view of a cross-sectional structure of a power module according to a ninth preferred embodiment. An XYZ orthogonal coordinate system is illustrated in FIG. 14. Note that the same reference numerals have been given to constituent elements that are similar to those of the first preferred embodiment, and descriptions thereof have been appropriately omitted.

As illustrated in FIG. 14, a feature of the power module of the ninth preferred embodiment is that the external electrodes 21 and 22 of the first preferred embodiment or the external electrode 23 of the second preferred embodiment is replaced by external electrodes 33A, 33B, and 34 (first, second, and third external electrodes). The external electrodes 33A and 33B are provided on the wiring pattern 11, and the external electrode 34 is provided on the wiring pattern 12.

The ninth preferred embodiment is characterized in that the external electrode 33B is disposed closer to the central portion of the insulating substrate 1 than the external electrodes 33A and 34, substrate connection parts E3 of the external electrodes 33A and 34 each include a narrow-width region E3x as in the eighth preferred embodiment, and a substrate connection part E3 of the external electrode 33B does not include a narrow-width region E3x.

The power module of the ninth preferred embodiment with the above-described structure can achieve the following effect in addition to the effect of the first or second preferred embodiment.

In the ninth preferred embodiment with the above-described feature, the external electrode 33B that does not include the narrow-width region E3x can effectively suppress deformation of the central portion of the insulating substrate 1 that undergoes relatively large displacement. In addition, the above-described stress can be reduced by providing the narrow-width region E3x in only the external electrodes 33A and 34 that are provided in regions where the stress on the interface of connection between the insulating substrate 1 and the external electrode 33A or 34 is relatively larger than in the central portion of the insulating substrate 1. This consequently improves the reliability of the device effectively at the connections between the substrate connection parts E3 of the external electrodes 33A, 33B, and 34 and the insulating substrate 1.

Tenth Preferred Embodiment

Figure 15:
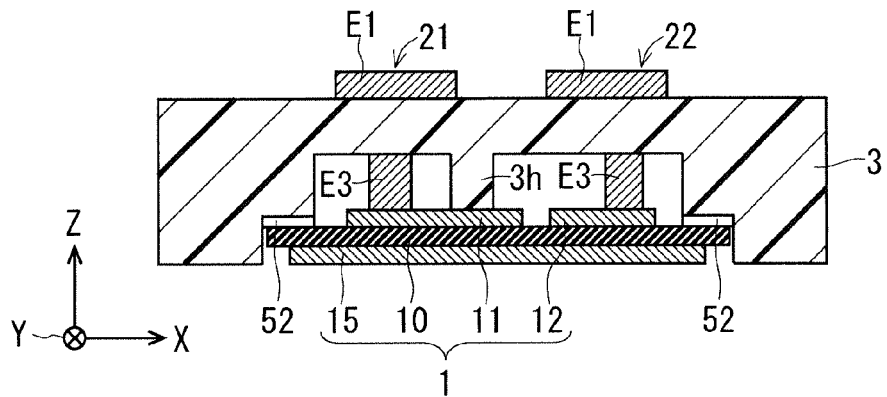
FIG. 15 is a cross-sectional view of a cross-sectional structure of a power module according to a tenth preferred embodiment.

FIG. 15 is a cross-sectional view of a cross-sectional structure of a power module according to a tenth preferred embodiment. An XYZ orthogonal coordinate system is illustrated in FIG. 15. FIG. 15 corresponds to the cross section A-A in FIG. 1. Note that the same reference numerals have been given to constituent elements that are similar to those of the first preferred embodiment, and descriptions thereof have been appropriately omitted.

As illustrated in FIG. 15, a feature of the power module of the tenth preferred embodiment is that a substrate pressing part 3h that extends downward from part of the bottom surface of the housing case 3 and comes in contact with the wiring pattern 11 is additionally provided in the structure of the first preferred embodiment.

In this way, the housing case 3 of the power module of the tenth preferred embodiment extends from above to below and includes the substrate pressing part 3h that is in contact with the wiring pattern 11 on the surface of the insulating substrate 1.

The presence of the substrate pressing part 3h can suppress deformation of the insulating substrate 1 even in a region on the front surface side of the insulating substrate 1 where the external electrodes 21 and 22 are not disposed.

While the above tenth preferred embodiment describes a structure in which the substrate pressing part 3h is provided in the housing case 3 of the power module of the first preferred embodiment illustrated in FIGS. 1 to 3, the substrate pressing part 3h may also be provided in the housing cases 3 of the other second to ninth preferred embodiments in the same manner.

Eleventh Preferred Embodiment

Figure 16:
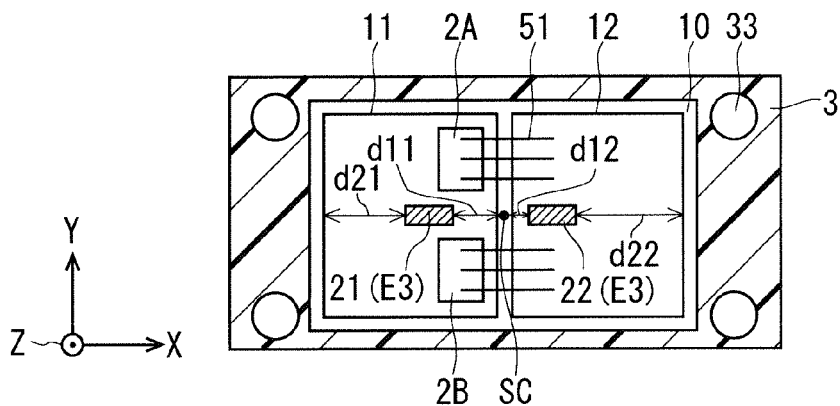
FIG. 16 is a plan view of an upper surface structure of a power module according to an eleventh preferred embodiment.

FIG. 16 is a plan view of an upper surface structure of a power module according to an eleventh preferred embodiment. An XYZ orthogonal coordinate system is illustrated in FIG. 16. Note that the same reference numerals have been given to constituent elements that are similar to those of the first preferred embodiment, and descriptions thereof have been appropriately omitted.

As illustrated in FIG. 16, a feature of the power module of the eleventh preferred embodiment is that the substrate connection parts E3 of the external electrodes 21 and 22 of the first preferred embodiment are disposed in the vicinity of an insulating-substrate central point SC. To be more specific, referring to the external electrode 21, a distance d11 from the insulating-substrate central point SC to the substrate connection part E3 is shorter than a distance d21 from the outer edge of the insulating plate 10 to the substrate connection part E3. Referring to the external electrode 22, a distance d12 from the insulating-substrate central point SC to the substrate connection part E3 is shorter than a distance d22 from the outer edge of the insulating plate 10 to the substrate connection part E3.

In this way, the power module of the eleventh preferred embodiment is characterized in that the substrate connection parts E3 of the external electrodes 21 and 22 are provided in regions that are closer to the central portion of the insulating substrate 1 than to the peripheral portion thereof.

The eleventh preferred embodiment with the above feature can suppress deformation of the central part of the insulating substrate 1 that can become most deformed due to changes in temperature, and therefore, can achieve the effect of improving the reliability of the device.

While the above-described eleventh preferred embodiment is applied to the arrangement of the external electrodes 21 and 22 of the power module according to the first preferred embodiment illustrated in FIGS. 1 to 3, it is also applicable to the arrangement of the external electrodes according to the other second to tenth preferred embodiments.

Twelfth Preferred Embodiment

Figure 17:
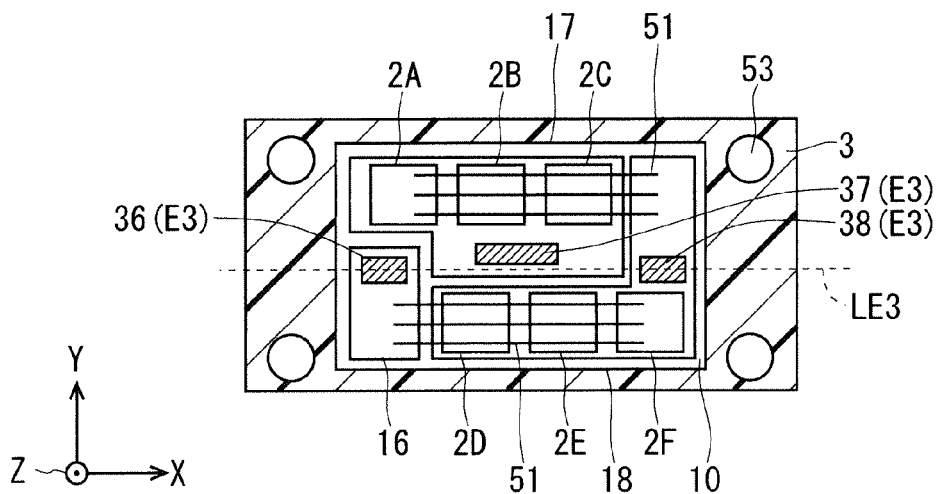
FIG. 17 is a plan view of an upper surface structure of a power module according to a twelfth preferred embodiment.

FIG. 17 is a plan view of an upper surface structure of a power module according to a twelfth preferred embodiment. An XYZ orthogonal coordinate system is illustrated in FIG. 17. Note that the same reference numerals have been given to constituent elements that are similar to those of the first preferred embodiment, and descriptions thereof have been appropriately omitted.

As illustrated in FIG. 17, a feature of the power module of the twelfth preferred embodiment is that wiring patterns 16 to 18 are provided on the insulating plate 10, semiconductor elements 2A, 2B, and 2C (first semiconductor elements) are provided on the wiring pattern 17, and semiconductor elements 2D, 2E, and 2F (second semiconductor elements) are provided on the wiring pattern 18. For example, when the power module of the twelfth preferred embodiment forms an inverter, the semiconductor elements 2A, 2B, and 2C serve as semiconductor elements such as IGBTs for high-voltage driving that are connected to a P terminal on the high voltage side, and the semiconductor elements 2D, 2E, and 2F serve as semiconductor elements for low-voltage driving that are connected to an N terminal on the low voltage side. In other words, the power module of the twelfth preferred embodiment includes two types of semiconductor elements 2A, 2B, 2C and 2D, 2E, 2F that are driven at different voltage levels.

Moreover, external electrodes 36 to 38 are provided on the wiring patterns 16 to 18. The external electrodes 36 to 38 are provided between the semiconductor elements 2A, 2B, 2C and the semiconductor elements 2D, 2E, 2F along an electrode forming line LE3 that is linear in plan view.

In this way, the power module of the twelfth preferred embodiment is characterized in that substrate connection parts E3 of the external electrodes 36 to 38 are disposed along the linear electrode forming line LE3 provided between the semiconductor elements 2A, 2B, 2C and the semiconductor elements 2D, 2E, 2F that are driven at different voltage levels. Note that it is sufficient for the substrate connection parts E3 of the external electrodes 36 to 38 to be located in the vicinity of the electrode forming line LE3, and they may be spaced a little away from the electrode forming line LE3, like the substrate connection part E3 of the external electrode 37.

The twelfth preferred embodiment with the above-described feature can create a space for forming the substrate connection parts E3 between the semiconductor elements 2A, 2B, 2C and the semiconductor elements 2D, 2E, 2F. This reduces thermal interference between the semiconductor elements 2A, 2B, 2C and the semiconductor elements 2D, 2E, 2F and thereby suppresses deformation of the insulating substrate 1 associated with changes in temperature.

When IGBTs and diodes are used between the semiconductor elements 2A, 2B, 2C or the semiconductor elements 2D, 2E, 2F that are driven at the same voltage level, it is desirable for the IGBTs and diodes to be alternately disposed to further reduce thermal interference. Alternatively, an interconnection region may be provided in the wiring patterns 17 and 18 between the IGBTs and the diodes.

Thirteenth Preferred Embodiment

Figure 18:
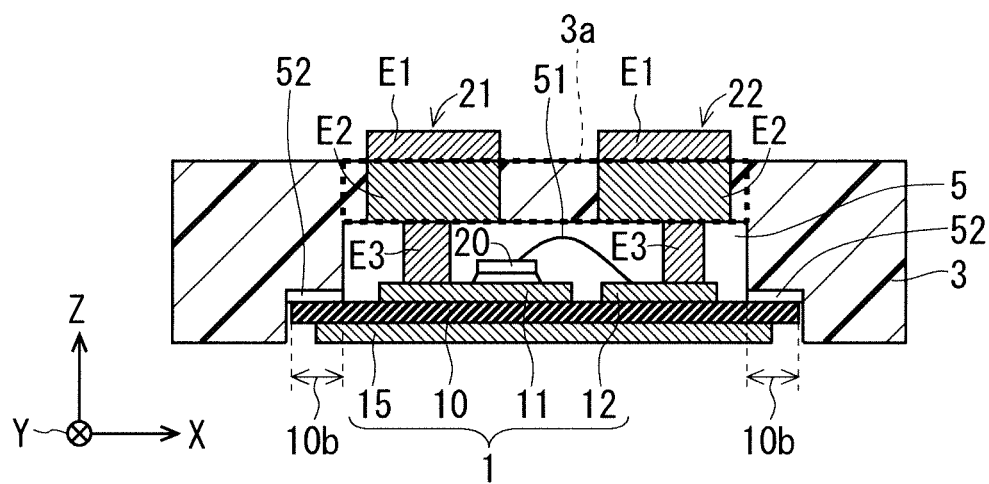
FIG. 18 is a cross-sectional view of a cross-sectional structure of a power module according to a thirteenth preferred embodiment.

FIG. 18 is a cross-sectional view of a cross-sectional structure of a power module according to a thirteenth preferred embodiment. An XYZ orthogonal coordinate system is illustrated in FIG. 18. Note that FIG. 18 corresponds to the cross section A-A in FIG. 1, the same reference numerals have been given to constituent elements that are similar to those of the first preferred embodiment, and descriptions thereof have been appropriately omitted.

As illustrated in FIG. 18, a feature of the power module of the thirteenth preferred embodiment is that the semiconductor element 2 of the first preferred embodiment is replaced by a SiC semiconductor element 20 made of silicon carbide (SiC).

With the presence of the SiC semiconductor element 20, the power module of the thirteenth preferred embodiment with the above feature can be a high-current density power module, but the deformation of the insulating substrate 1 due to changes in temperature becomes greater than with the semiconductor element 2 made of silicon. However, the deformation of the insulating substrate 1 can be suppressed by causing the pressure of the external electrodes 21 and 22 to be exerted on the insulating substrate 1 as in the first preferred embodiment. It is thus possible to improve the reliability of the device even in the case of using the SiC semiconductor element 20.

In addition, SiC produces smaller loss than Si. Thus, the power module of the thirteenth preferred embodiment using the SiC semiconductor element 20 can reduce consumption in energy.

While the above thirteenth preferred embodiment describes a structure in which the semiconductor element 2 of the power module of the first preferred embodiment illustrated in FIGS. 1 to 3 is replaced by the SiC semiconductor element 20, the semiconductor elements 2 of the other second to twelfth preferred embodiments may also be replaced by the SiC semiconductor element 20 in the same manner.

Fourteenth Preferred Embodiment

Figure 19:
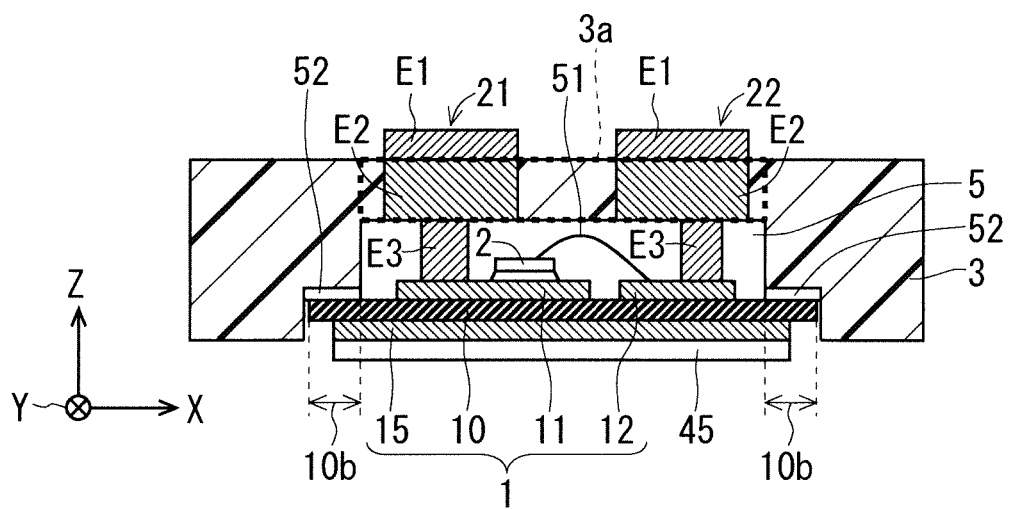
FIG. 19 is a cross-sectional view of a cross-sectional structure of a power module according to a fourteenth preferred embodiment.

FIG. 19 is a cross-sectional view of a cross-sectional structure of a power module according to a fourteenth preferred embodiment. An XYZ orthogonal coordinate system is illustrated in FIG. 19. Note that FIG. 19 corresponds to the cross section A-A in FIG. 1, the same reference numerals have been given to constituent elements that are similar to those of the first preferred embodiment, and descriptions thereof have been appropriately omitted.

As illustrated in FIG. 19, a feature of the fourteenth preferred embodiment is that a heat dissipating material 45 is further provided on the backside electrode 15 of the first preferred embodiment. The heat dissipating material 45 makes phase transition due to changes in temperature and becomes a solid at near room temperature. Typically, this heat dissipating material 45 is fixedly fastened to a heat sink (not shown).

The power module of the fourteenth preferred embodiment with the above feature employs a structure in which the external electrodes 21 and 22 press the insulating substrate 1 as in the first preferred embodiment. Thus, the deformation of the insulating substrate 1 can be suppressed by the effect of the first preferred embodiment.

Accordingly, even in the case of using the heat dissipating material 45 that becomes a solid at near room temperature, no cracks occur in the insulating plate 10 of the insulating substrate 1 at the time of fastening the heat sink, and higher thermal conductivity can be achieved than in the case of using a liquid heat dissipating material. This brings about the effect of being able to reduce thermal resistance.

While the above first to fourteenth preferred embodiments describe structures in which the external electrodes 21 and 22 or other constituent elements are formed on the wiring patterns 11 and 12 or the like, a structure is also possible in which the external electrodes 21 and 22 or other constituent elements are formed on the semiconductor element 2. In other words, it is sufficient for the external electrodes 21 and 22 or other constituent elements to be electrically connected to the wiring patterns 11 and 12 or the semiconductor element 2 (including the SiC semiconductor element 20) and to be provided on the one main surface of the insulating substrate 1.

It is to be understood that embodiments described above can be freely combined, modified, or omitted as appropriate within the scope of the invention.

While the invention has been shown and described in detail, the foregoing description is in all aspects illustrative and not restrictive. It is therefore to be understood that numerous modifications and variations can be devised without departing from the scope of the invention.

What is claimed is:

1. A semiconductor device comprising:
   an insulating substrate having one main surface and the other main surface that are formed in a horizontal-direction and having a wiring pattern on the one main surface side;
   a semiconductor element formed on the one main surface side of said insulating substrate;
   an external electrode having electrical connection with said wiring pattern or said semiconductor element and provided on the one main surface of said insulating substrate; and
   a housing case that houses said insulating substrate and said semiconductor element, said housing case including an electrode insertion region on the one main surface side of said insulating substrate, the electrode insertion region containing at least part of an electrode insertion part of said external electrode,
   wherein said external electrode includes a horizontal-direction electrode region formed in said horizontal direction, said horizontal-direction electrode region being configured to have an upper surface that is in physical contact with said electrode insertion region.

2. The semiconductor device according to claim 1, wherein
   said horizontal-direction electrode region serving as part of said electrode insertion part is inserted in said electrode insertion region.

3. The semiconductor device according to claim 1, wherein
   the upper surface of said horizontal-direction electrode region is provided in contact with a bottom surface of said electrode insertion region.

4. The semiconductor device according to claim 1, wherein
   the one main surface of said insulating substrate includes a case bonding region that adheres to said housing case,
   said insulating substrate further includes an internal electrode on the other main surface side, and
   said internal electrode includes a region that overlaps with said case bonding region when viewed in plan view.

5. The semiconductor device according to claim 4, wherein
   said internal electrode has a plurality of recessed parts in an outer peripheral region on the other main surface side, each of said plurality of recessed parts including at least a region that is recessed from the other region to the one main surface side.

6. The semiconductor device according to a claim 1, wherein
   said external electrode includes:
   an external connection part provided outside said housing case; and
   a substrate connection part having direct connection with the one main surface of said insulating substrate,
   said electrode insertion part is provided between said external connection part and said substrate connection part, and
   a width of said electrode insertion part in at least one of first and second directions that define said horizontal direction is set to be greater than widths of said external connection part and said substrate connection part.

7. The semiconductor device according to claim 1, wherein
   said external electrode includes first and second external electrodes,
   each of said first and second external electrodes includes:
   an external connection part provided outside said housing case; and
   a substrate connection part having direct connection with the one main surface of said insulating substrate,
   said electrode insertion part is provided between said external connection part and said substrate connection part, and
   each of said first and second external electrodes has at least part of said electrode insertion part inserted in said electrode insertion region.

8. The semiconductor device according to claim 7, wherein
   said electrode insertion parts of said first and second external electrodes are configured to at least partly overlap each other in said electrode insertion region when viewed in plan view or when viewed from a side.

9. The semiconductor device according to claim 1, wherein
   external electrode includes:
   an external connection part provided outside said housing case; and
   a plurality of substrate connection parts, each having direct connection with the one main surface of said insulating substrate, and
   said electrode insertion part is provided between said external connection part and said plurality of substrate connection parts.

10. The semiconductor device according to claim 1, further comprising:
    a signal terminal having electrical connection with said wiring pattern on said insulating substrate,
    wherein said signal terminal has lower current propagation capability than said external electrode, and
    at least part of said signal terminal is inserted in said housing case.

11. The semiconductor device according to claim 1, wherein
    said external electrode includes:
    an external connection part provided outside said housing case; and
    a substrate connection part having direct connection with the one main surface of said insulating substrate,
    said electrode insertion part is provided between said external connection part and said substrate connection part, and
    said substrate connection part includes a narrow-width region whose width is narrower than a width of the other region.

12. The semiconductor device according to claim 11, wherein
    said external electrode includes first and second external electrodes, each including said external connection part, said substrate connection part, and said electrode insertion part,
    said second external electrode is disposed closer to a central portion of said insulating substrate than said first external electrode, and
    said substrate connection part of said first external electrode includes said narrow-width region, and said substrate connection part of said second external electrode does not include said narrow-width region.

13. The semiconductor device according to claim 1, wherein
    said housing case extends from above to below and includes a substrate pressing part provided in contact with the one main surface of said insulating substrate.

14. The semiconductor device according to claim 1, wherein
said external electrode includes:
an external connection part provided outside said housing case; and
a substrate connection part having direct connection with the one main surface of said insulating substrate,
said electrode insertion part is provided between said external connection part and said substrate connection part, and
said substrate connection part is provided in a region that is located closer to a central portion of said insulating substrate than to a peripheral portion thereof.

15. The semiconductor device according to claim 1, wherein
said external electrode includes a plurality of external electrodes,
each of said plurality of external electrodes includes a substrate connection part having direct connection with the one main surface of said insulating substrate,
said plurality of external electrodes are provided along an electrode forming line that is linear in plan view, and
said semiconductor element includes first and second semiconductor elements that are driven at different voltage levels and arranged with said electrode forming line sandwiched therebetween.

16. The semiconductor device according to claim 1, wherein
said semiconductor element includes a semiconductor element made of silicon nitride.

17. The semiconductor device according to claim 1, further comprising:
a heat dissipating material on the other main surface side of said insulating substrate, said heat dissipating material being a solid at room temperature.

* * * * *